United States Patent [19]

Anderson, Jr. et al.

[11] Patent Number: 4,519,872

[45] Date of Patent: May 28, 1985

[54] USE OF DEPOLYMERIZABLE POLYMERS IN THE FABRICATION OF LIFT-OFF STRUCTURE FOR MULTILEVEL METAL PROCESSES

[75] Inventors: Herbert R. Anderson, Jr., Patterson; Harbans S. Sachdev; Krishna G. Sachdev, both of Wappingers Falls, all of N.Y.

[73] Assignee: International Business Machines Corporation, Armonk, N.Y.

[21] Appl. No.: 619,516

[22] Filed: Jun. 11, 1984

[51] Int. Cl.³ .................. B44C 1/22; C03C 15/00; C03C 25/06; B29C 17/08

[52] U.S. Cl. .................. 156/643; 29/580; 29/591; 156/644; 156/646; 156/652; 156/655; 156/661.1; 156/668; 204/192 E; 357/71; 427/90; 430/314; 430/317; 430/329

[58] Field of Search .............. 156/643, 644, 646, 653, 156/657, 662, 650–652, 654, 655, 656, 659.1, 661.1, 668; 252/79.1; 204/164, 192 EC, 192 E; 29/580, 591; 357/67, 71; 430/311, 312, 313, 315, 316, 317, 318, 329; 427/38, 39, 43.1, 88–91, 40, 41

[56] References Cited

U.S. PATENT DOCUMENTS

| | | | |
|---|---|---|---|
| 2,559,389 | 7/1951 | Beeber et al. | 41/43 |
| 3,535,137 | 10/1970 | Haller et al. | 117/8 |
| 3,849,136 | 11/1974 | Grebe | 96/36.2 |
| 3,934,057 | 1/1976 | Moreau et al. | 427/43 |
| 3,985,597 | 10/1976 | Zielinski | 156/11 |
| 4,004,044 | 1/1977 | Franco et al. | 427/43 |
| 4,119,483 | 10/1978 | Hubsch et al. | 156/655 |
| 4,181,755 | 1/1980 | Liu et al. | 430/314 |
| 4,202,914 | 5/1980 | Havas et al. | 427/38 |
| 4,224,361 | 9/1980 | Romankiw | 427/259 |
| 4,272,561 | 6/1981 | Rothman et al. | 427/84 |
| 4,328,263 | 5/1982 | Kurahashi et al. | 427/93 |
| 4,367,119 | 1/1983 | Logan et al. | 156/643 |

OTHER PUBLICATIONS

IBM Technical Disclosure Bulletin, vol. 22, No. 2, Jul. 1979, p. 541 for "Gamma Radiation Treatment to Enhance the Unzipping of Poly . . . ".

IBM Technical Disclosure Bulletin, vol. 22, No. 2, Jul. 1979 for "Unzippable Polymers for Green Sheets", by H. R. Anderson, Jr. et al., p. 542.

IBM Technical Disclosure Bulletin, vol. 15, No. 1, Jun. 1972, p. 174 for "Solventless Development of Polymeric Films", by C. A. Cortellino et al.

NEPCON Prize Paper Contest-Technical Session 11: "Hybrid Circuit Components and Assemblies", by K. C. Hu, Radio Corporation of America Laboratories, Princeton, N.J.—Expendable Mask: A New Technique for Patterning Evaporated Metallic Films, Oct. 1967—pp. 84–94.

Primary Examiner—William A. Powell
Attorney, Agent, or Firm—Edward W. Brown

[57] ABSTRACT

An improved lift-off process for multilevel metal structure in the fabrication of integrated circuits by employing lift-off layer formed from polymers which undergo clean depolymerization under the influence of heat or radiation and allow rapid and residue-free release of an "expendable mask". An embedded interconnection metallurgy system is formed by application of the lift-off layer of this invention over a cured polymer film or on an oxygen RIE barrier layer previously deposited on organic or inorganic substrate, followed by another barrier over which is then coated a radiation sensitive resist layer. After definition of the desired resist pattern by imagewise exposure and development, the image is replicated into the barrier by sputter etching in a fluorine containing ambient and subsequently into the base layer down to the substrate by oxygen reactive ion etching which is followed by blanket metal evaporation and finally the lift-off by brief heat treatment at the depolymerization temperature of the lift-off layer, and brief solvent soak.

24 Claims, 13 Drawing Figures

USE OF DEPOLYMERIZABLE POLYMERS IN THE FABRICATION OF LIFT-OFF STRUCTURE FOR MULTILEVEL METAL PROCESSES

BACKGROUND OF THE INVENTION

This invention relates to a process for forming an interconnection metallurgy system for high density semiconductor devices and particularly to an improvement in the lift-off materials and processes required for multilevel metal structure embedded in a passivating layer with a planarized surface.

DESCRIPTION OF THE PRIOR ART

A typical process for forming interconnection metallurgy system for integrated circuit devices includes delineation of a desired metallurgy pattern by the resist-expose-develop sequence followed by sputter etching or RIE and metal deposition. Second metal level is similarly defined to form metal to metal contact with the underlying layer through via holes in an insulating layer between the two levels. Alternative methods commonly employed for multilevel metal processes in integrated circuits are termed "expendable mask method", "lift-off method" or "stencil method" as described in the following references:

K. C. Hu, "Expendable Mask: A New Technique for Patterning Evaporated Metal Films", Electron Packaging and Production, October 1967.

U.S. Pat. No. 2,559,389 granted July 3, 1951 for "METHOD OF PRODUCING PRECISION IMAGES" by A. R. A. Beeber et al.

Improvements to the basic "lift-off" method are described in U.S. Pat. Nos. 3,849,136, 4,004,044, and 4,202,914 according to which a non photosensitive organic polymer film is first spin applied on a substrate, cured to render it thermally stable and is then overlaid with a thin film of an inorganic material, preferably a metallic mask as a barrier layer followed by a resist layer. The desired metallurgy pattern is formed by the conventional photolithographic techniques used in the integrated circuit fabrication art. The metallic mask functions as an oxygen reactive ion etch barrier during reactive etching to form imagewise openings through the base layer extending to the substrate. A subsequent metallization step and removal of the "lift-off" mask is accomplished by the conventional technique involving immersion into a solvent that dissolves, swells or releases the base polymeric film and provides imagewise metal pattern on the substrate.

A further improvement in the "lift-off" technique that overcomes the non-planarity problem in the above methods when applied to multilevel metal structures, is described in U.S. Pat. No. 3,985,597. According to the planar process claimed in this document for forming interconnection metallurgy system, a base layer is applied on a substrate and is followed sequentially by a solvent removable "lift-off" layer, a thin oxygen RIE resistant layer and a resist layer. The desired metal pattern is defined by the usual photolithographic technique and is then replicated into the underlying layers down to the substrate by RIE alternately with $CF_4$ and $O_2$. This is followed by the metallization step and "lift-off" by an extended soak in a solvent such as N-methylpyrrolidone. The preferred materials for the planar process claimed in U.S. Pat. No. 3,985,597 are: polyimide for the base layer, polysulfone resins, such as those available from ICI (Imperial Chemical Industry) for the "lift-off" layer, glass resin polymer (for example, "glass resin" type 650 from Owens Illinois, Inc.), for the masking layer which is overcoated with a photoresist layer. Although this approach is designed to provide planar multilevel metal processes which are of crucial importance in large scale integrated circuit fabrication to eliminate the failure mechanisms originating from possible current crowding of metallurgical lines and electromigration, it is subject to limitations of the performance of the conventional polysulfone resin, as the lift-off layer.

For example, a protracted soak in a powerful solvent such as NMP at 80°–85° is required to cause "lift-off" with this material. Under these conditions, the fully cured polyimide base layer swells due to solvent permeation causing stress cracking of the silicon nitride film used as a built-in etch stop. Furthermore, the soak time necessary for lift-off is variable and is affected by the process conditions employed for metal deposition. For example, it is observed that a longer soak time is required when metallization is carried out by electron beam evaporation as compared to RF evaporation. Also, because of the sensitivity of such polysulfone resins to moisture, the coatings are to be carried out under low controlled humidity but still occasional problems of film dewetting during spin application on various substrates, and cracking of contacting layers are observed upon curing at high temperature.

OBJECT OF THE INVENTION

This invention is concerned with a replacement of the polysulfone "lift-off" material to provide improvements in the overall process for the fabrication of multilevel-metal-structures.

It is a primary object of the present invention to provide improved materials and processes for use in "lift-off" processes employed in the integrated circuit technology.

One object of the invention is to provide an improved lift-off method for forming metal interconnection system.

Another object is to replace conventional polysulfone lift-off layers with polymer coatings that require less rigorous conditions for removing the lift-off mask subsequent to metallization.

Another object is to provide a lift-off method that obviates swelling of the underlying polyimide film and consequent cracking of the overlying barrier film such as silicon nitride or silicon oxide.

Another object is to utilize depolymerizable polymers for the lift-off layer.

Another object is to obtain lift-off by thermally-induced depolymerization of the lift-off film susbsequent to metal evaporation.

Another object is to obtain lift-off by brief thermal treatment that causes depolymerization or molecular weight reduction, followed by short soak in an appropriate solvent.

Another object is to provide a lift-off process which obviates protracted exposure to powerful solvent such as N-methylpyrrolidone.

Another object is to provide crack-free via structures prepared with organic insulators such as polyimide, polyphenylenes, polyquinoxalines, etc. along with other high temperature polymers, and inorganic barrier layers such as silicon nitride or silicon oxide.

It is also the object of this invention to provide lift-off coatings which are free from humidity related problems, have superior adhesion to most organic or inorganic contacting films, and can be cast from solvents which can be removed at relatively low temperature.

DISCLOSURE OF THE INVENTION

The invention disclosed herein provides an improved lift-off process in the fabrication of planar multilevel-metal structures through the use of depolymerizable polymers for the lift-off layer which is removed efficiently by first subjecting the post-metallized structure to short-thermal treatment at the depolymerization temperature of the lift-off polymeric system, and subsequent short solvent soak. For the overall process sequence to define various levels of metallization, a reference can be had in the planar polyimide process with built-in etch-stop as described in U.S. Pat. No. 3,985,597 which employs a thin plasma enhanced chemically vapor deposited silicon nitride as oxygen etch-stop and dual dielectric.

According to this invention, the process for forming interconnection metallurgy system involves forming on a substrate a base layer of a thermosetting resin such as polyimide followed sequentially by an oxygen RIE barrier layer, the depolymerizable polymer layer, an oxygen RIE barrier layer and finally a resist layer. A desired metallurgy pattern is defined by the conventional lithographic process, replicated into the underlying layers by RIE followed by the metallization step such that the metallization temperature is at least 30°–50° below the decomposition temperature of the lift-off polymer selected. The release of the lift-off is then accomplished by heating the structure for 2–10 minutes followed by solvent soak which requires relatively short times since the prior thermal treatment causes enough disruption, adhesion failure and porosity in the film structure to allow effective solvent permeation and accelerated dissolution of the oligomeric species generated.

BRIEF DESCRIPTION OF THE DRAWINGS

A process for forming metallurgical pattern on a substrate is illustrated in FIGS. 1 to 13 for various states in the fabrication of multilevel metal structure utilizing concepts/materials/processes described in this invention.

DESCRIPTION OF PREFERRED EMBODIMENT

Figure 1:
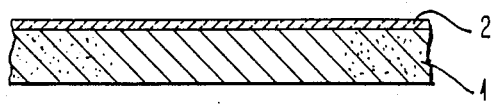

The materials suitable for use according to this invention are specifically given and described in following portions of this application. Though these systems are broadly useful in a variety of applications, this document describes their use as lift-off layers in multilevel metal processes for high density integrated circuit devices. While this invention is described with respect to various preferred embodiments, it is not intended to be limited to these systems and would include modification, variations that are within the general scope of the invention. The materials listed below can be used singly or in admixture with each other so as to obtain optimum film properties in terms of thermal stability, mechanical strength, adhesion and compatibility with organic and inorganic contacting layers. These improved materials for the lift-off layer are characterized by high glass transition temperature ($T_g > 100°$ C.) and may be employed as replacement for polysulfones in the conventional process using silicon nitride or silicon oxide as barrier layers or in a modified packaging scheme using plasma-polymerized organosilicons as oxygen RIE barriers and a second dielectric as disclosed in the co-pending application Ser. No. 565,562 filed, Dec. 27, 1983, for "Multilevel Metal Structures and Process Using Plasma Polymerized Organosilicon Films".

Polymers suitable for use in the practice of this invention include the following:
Polymethylmethacrylate—PMMA
  Poly(methylmethacrylate—co-methacrylic acid)—Poly(MMA-MAA)
Poly(methylmethacrylate—co-methacrylamide)
Poly(methylmethacrylate—methacrylic anhydride-methacrylic acid)—poly(MMA-MAA-MA)
Polymethacrylamide
Poly(adamantylmethacrylate)
Poly-α-methylstyrene—(PαMS)
Polymethylisopropenyl ketone
Polyoxyethylene, polyoxymethylene
Poly olefin sulfones
Polyphenylmethacrylate (PPMA)
Poly(benzylphenyl) methacrylate (PBPMA)
Polyisobutylene
Polytetrafluoroethylene For the purpose of this invention it is required that the polymeric material selected be free of volatile contaminants and low molecular weight monomeric/oligomeric species and that the temperature at which the material softens, melts and depolymerizes is high enough to withstand the processing/metallization temperature optimized for a specific product application so as to eliminate the possibility of undesired outgassing or image flow during the various stages of structure fabrication.

The preferred materials of this invention have medium to high molecular weights with relatively narrow molecular weight distribution to assure uniformity of functional performance. For PMMA, preferred molecular weight range is from 60,000 to 100,000. For poly($\alpha$-methylstyrene), from 20,000 to medium MW of about 200,000 and high $\overline{MW}$ of about 500,000 and for poly (MMA-MAA) with 65:35 MMA to MAA ratio, the preferred molecular weight range is 40,000 to about 80,000. Among the various stereo chemical forms of these polymers, "atactic" configuration is particularly preferred for the purpose of this invention.

In general, films derived from higher molecular weight materials have superior mechanical integrity and adhesion with contacting films. For optimum integrity of the desired metallurgy, it is important that the solvent cast films of materials described herein be pre-baked at high enough temperature to drive off solvent, other volatile contaminants and oligomeric species. This can be accomplished by vacuum bake at a suitable temperature which is pre-determined from the thermal analysis data for a particular material. Thermal studies including thermogravimetric analysis and differential scanning calorimetry of PMMA, Poly (MMA-MAA), PαMS, PPMA and PBPMA show that in order for no weight loss to occur up to 300° C., these materials require prebake at 260°, 280°, 257°, 270°, and 270° C., respectively. However, at the lift-off stage, heating to 340° C. or above causes enough decomposition and/or depolymerization and consequent matrix disruption which facilitates dissolution or release in various lift-off solvents.

PROCESS DESCRIPTION

A multilevel metal process using the lift-off materials of the present invention consists of the following generalized sequence of steps as illustrated in FIGS. 1 to 13, of which specific descriptions follow thereafter.

1. Forming a cured organic polymer layer such as polyimide on a substrate typically monocrystalline silicon with a dielectric layer having contact openings for contact with active and passive devices. Alternate substrates such as ceramic, glass or other insulating materials can also be employed according to the process described herein to form metallurgy on a module for supporting integrated circuit devices and associated circuitry.

2. Deposition of a thin masking layer by plasma or PECVD (plasma enhanced chemical vapor deposition), e.g., silicon nitride, silicon oxide or plasma polymerized organosilicons disclosed in co-pending application Ser. No. 565,562, filed Dec. 27, 1983, for "Multilevel Metal Structures and Process Using Plasma Polymerized Organosilicon Films". Solution coated "glass resin" type materials, as described in U.S. Pat. No. 4,004,044 may also be utilized for this application.

3. Application of a depolymerizable lift-off layer according to this invention by spin coating of 10-40% solution of the polymer in a suitable solvent followed by prebake at a temperature at least 50° C. below the depolymerization temperature of the material selected.

4. Deposition of an oxygen reactive ion etch resistant layer as described in Step 2 above, to serve as a barrier during image transfer into the underlying layers by RIE (Reactive Ion Etching) in an $O_2$ containing ambient.

5. Deposition of a resist layer by spin coating, followed by prebake at an appropriate temperature therefor. The thickness of this film may be typically in the range 1-3 um.

6. Depending on the resist characteristics, the desired metallurgy pattern is defined by optical, E-beam, X-ray or Ion beam lithography in the resist layer by well known techniques.

7. After image development, the pattern is replicated into the underlying layers by RIE in a $CF_4$ containing ambient, to etch the barrier, in an $O_2$ containing ambient to etch the lift-off layer, again in $CF_4$ to etch the barrier layer and finally again in an $O_2$ containing ambient to etch the polyimide layer.

8. Metal evaporation, such as Al/Cu alloy by E-beam or RF evaporation at a temperature that is preferably about 50° C. below the depolymerization temperature of the lift-off polymers.

9. Brief thermal treatment of the metallized structure at the depolymerization temperature of the lift-off materials followed by immediate soak in a suitable solvent selective for the lift-off layer but not for the base polymeric layer to cause release of the lift-off mask leaving behind the patternwise metallurgy.

These steps can be repeated for subsequent levels of metallization as found necessary. Following specific examples are provided for illustrative purposes.

More specifically, a substrate, typically a semiconductor monocrystalline silicon or a ceramic or glass with metal lines, (not shown) is provided with an overlying layer 2 of a dielectric as for example $Si_3N_4$, $SiO_2$, $SiO_x$ or $Ta_2O_5$. The substrate 1 for purpose of illustration, can be an integrated circuit device having active and passive devices fabricated therein (not shown) which are suitably isolated from each other. The dielectric layer 2 is provided with contact openings (not shown here) for making electrical contact with devices underneath. For application to packaging, the substrate could also be glass-ceramic or alumina ceramic with metallurgy for appropriate integrated circuit devices with associated circuitry.

Figure 2:
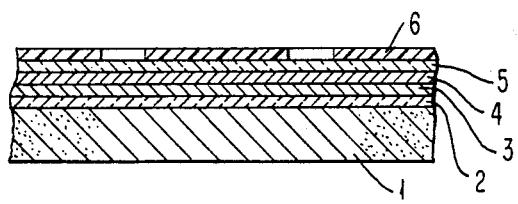

As shown in FIG. 2, a layer 3 of an insulator organic resin is deposited over layer 2. Illustratively, the material for this layer can be the polyimide Pyralin (RC-5878) manufactured by E. I. duPont deNemours, which is applied in thickness of 1-5 microns. For device fabrication the preferred thickness is 1-2 microns while for packaging 4-5 micron thick film can be employed.

The substrate is then coated with layer 4 which comprises an organic polymer depolymerizable under the influence of heat. Typical materials for this layer are polymethylmethacrylate, poly (methacrylic acid, poly-α-methylstyrene, methacrylic anhydride methylmethacrylate) terpolymer prepared by heating a methylmethacrylate-methacrylic acid copolymer (60:40) at 220°-240° C. for a period of 20-40 minutes. Also comprehended are poly(pentene-1-sulfone) and polyalkylaryl ketones. Other polymers, comprehended within this invention, are those derived from organic monomers with substitution in the 2 position of the double bond (shown here) can be also used.

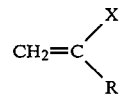

where X=$CH_3$, $CF_3$, $C_2H_5$, $C_6H_5$, and R can be $C_6H_5$, /$COOCH_3$/$COOH$ $COC_6H_5$,/$C_2HH_5$, —$CONH_2$ Typical thickness for the layer 4 is 0.3-1 micron for integrated circuit device, and 1-3 microns for packaging.

The use of thermally depolymerizable polymers for facilitating lift-off represents a major departure from the previous art.

Figure 3:
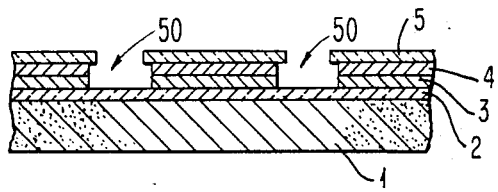
Figure 4:
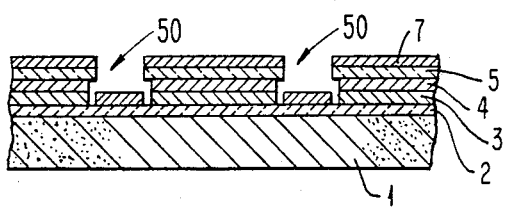

The deposited layer 5, as shown in FIG. 3, can be any material resistant to reactive ion etching, where the material of this layer can be plasma deposited organosilicon divinyl tetramethyl disiloxane or hexamethyldisilazane (1200-2000 Å) as discussed in copending application Ser. No. 565,562 for "Multilevel Metal Structures and Process Using Plasma Polymerized Organosilicon Films" filed Dec. 27, 1983, or $Si_xN_yH_z$. However, inorganic materials such as $SiO_xSiO_2$, $Al_2O_3$, and the like, can also be deposited and employed. In the case of plasma deposited organosilicon layer, it is preferably annealed at about 250° C. for about 10 minutes subsequent to deposition.

A layer 6 of a positive photoresist, as for example, the azoplate novolak type resist, AZ 1350 J, is then deposited on layer 5 according to well established technology. As shown in FIG. 3 the imaged pattern after development is transferred as vias or access openings 50 into layers 5, 4 and 3 according to the methodology described in U.S. Pat. No. 4,367,119 and said copending application Ser. No. 565,562.

A suitable apparatus for reactive ion etching (RIE) is given in U.S. Pat. No. 3,584,710.

A conductive metallic layer 7, for example, of Al/Cu then evaporated over the substrate structure while maintaining the substrate temperature at about 80° C. or less. The metallization also results in metal deposition on layer 2 through the openings 50. The thickness of 7 is preferably approximately equal to that of 3.

Figure 5:
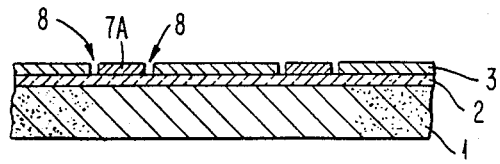

Shown in FIG. 5 is the structure obtained upon removal of all the layers above patterned layer 3 which is accomplished as given in the following. The substrate is heated at 290°-300° C. under nitrogen for 10 minutes and immediately transferred to a digylme or diglyme-NMP bath at 60° equipped with Macronatics Jet Etcher (manufactured by Macronatics Inc. Calif.). The lift off is invariably complete in 1-10 minutes. The substrate is rinsed in digylme and finally in deionized water. The resultant metal patterns or segments 7A surrounded by patterned layer 3, e.g. the aforesaid (Polyimide 5878) are essentially planar. In order to ensure integrity of the metallurgy, post metallization sintering is carried out above 300° C. in a reducing atmosphere.

The above lift off technique employing depolymerizing polymer instead of a polysulfone (see U.S. Pat. No. 4,367,119) represents an important departure from the aggressive or harsh NMP treatment (from 5 to about 20 hours at 60°-90° C.) as practiced heretofore. Such a protracted soak in hot NMP is considered a serious reliability exposure since swelling of the polyimide layer can result in stress cracking and loss in adhesion particularly when employed contiguously with inorganic passivating, etch stop or etch barrier films of $Si_3N_4$ or $SiO_x$.

The small gaps or spaces 8 are filled with the polyimide used for layer 3 or any other suitable resin plastic when the second sequence of steps is used to form the next level of metallurgy. Again it is preferred to use duPont polyimide RC-5878 in two coats to achieve gap filling and higher plannarization.

Figure 6:
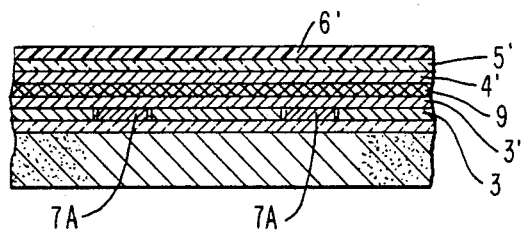
Figure 7:
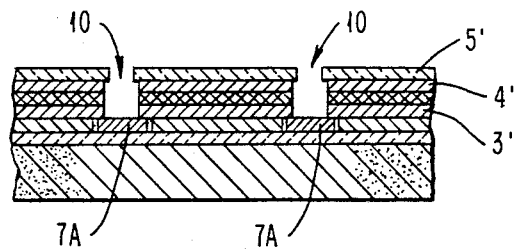
Figure 8:
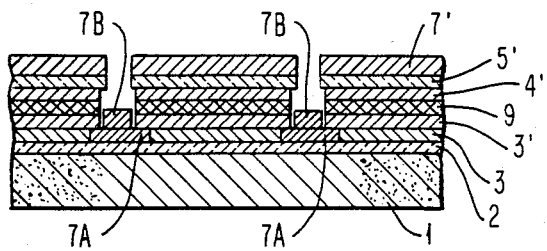

The layers 4',5' in FIG. 6 correspond to layers 4 and 5 in FIG. 2. A layer of photoresist 6' is then deposited on layer 5' and patterned suitably to furnish the via hole pattern 10 (FIG. 7) after sequentially developing the resist layer 6'; reactive ion etching of layer 5' with $CF_4$ ambient layer; 4' with $O_2$ ambient; layer 9 with $CF_4$ or a mixture of $O_2+CF_4$; and finally with, $O_2$ ambient again to make contact with 7A. At this stage a few seconds of optional sputter clean is recommended for removal of any trace residues on metal pattern or segments 7A. A metal layer 7' is then again blanket deposited leading to formation of the studs 7B in contact with metallurgy 7A to give the structure represented by FIG. 8.

Figure 9:
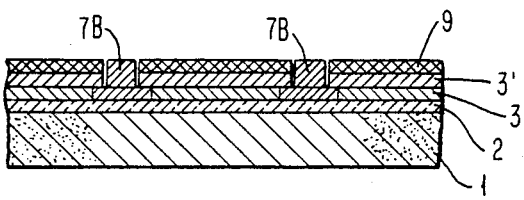
Figure 10:
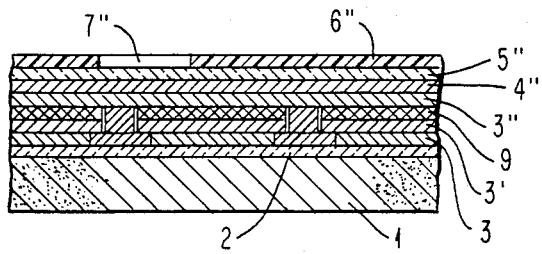
Figure 11:
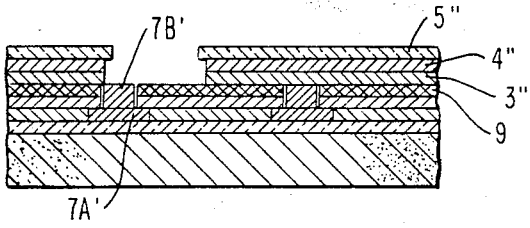
Figure 12:
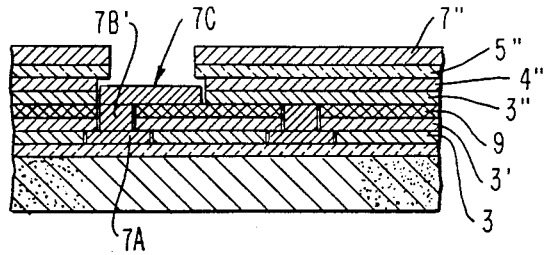
Figure 13:
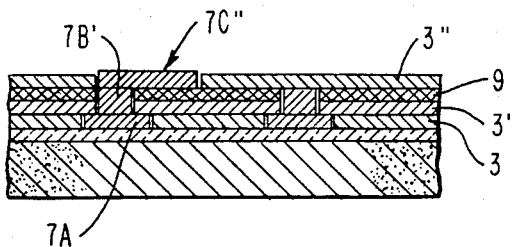

Lift off is again carried out by first heating at the depolymerization temperature of the lift off terpolymer that constitutes layer 4' i.e. heating at 290°-300° in nitrogen 5-15 minutes followed by quick transfer to a diglyme or diglyme-NMP (1:1) both equipped with Macronatics Jet Etcher. The lift off is accomplished in 1-10 minutes. Again the metallurgy is annealed as before. The resultant structure is shown in FIG. 9.

The above sequence of steps can be repeated to give further levels of metallurgy as shown, but not discussed in FIGS. 10 to 13.

While the invention here is described with reference to preferred embodiments of the invention, it will be understood that the invention is not limited to the construction of the structures described herein and the right is reserved to all modifications that are covered by the scope of this invention as presented in the attached claims.

Having thus described our invention, what we claim to be new and desire to secure by Letters Patent is:

1. A process for forming a metal pattern on a substrate which comprises:
    forming a mask of at least one thermally depolymerizable polymer on the substrate with a pattern of openings complementary to the desired metal pattern;
    blanket coating the substrate and the mask with a metal;
    heating to thermally depolymerize the thermally depolymerizable polymer; and
    thereafter immersing the resulting assembly in a solvent to lift-off the depolymerized polymer and any metal thereover leaving metal in the desired pattern on the substrate.

2. The process of claim 1 wherein the depolymerizable polymer is selected from the group consisting of polymethylmethacrylate acid and poly-α-methylstyrene.

3. The process of claim 1 wherein the weight average molecular weight of the depolymerizable polymer is 40,000 to about 100,000.

4. The process of claim 1 wherein the weight average molecular weight of the depolymerizable polymer is about 20,000 to about 500,000.

5. The process of claim 1 wherein the depolymerizable polymer is polymethylmethacrylate.

6. The process of claim 1 wherein the depolymerizable polymer is poly-α-methylstyrene.

7. The process of claim 1 wherein subsequent to forming the mask of the thermally depolymerizable polymer, but prior to heating the substrate to thermally depolymerize the depolymerizable polymer, heating is conducted at a temperature insufficient to thermally depolymerize the depolymerizable polymer but at a temperature sufficient to cause residual solvent and monomeric or low MW species to be removed.

8. The process of claim 1 wherein said substrate is a semiconductor substrate.

9. The process of claim 1 wherein said substrate is an alumina-ceramic substrate.

10. The process of claim 1 wherein said substrate is a glass-ceramic substrate.

11. A method for depositing a metallic conductive film on a substrate, comprising:
    (A) depositing over said substrate a blanket layer of a depolymerizable polymer;
    (B) lithographically forming, from said polymer, a layer depolymerizable mask having a pattern of openings to expose corresponding portions of said substrate;
    (C) coating a blanket layer of a conductive metallization over said mask and said exposed portions of said substrate;
    (D) thermally depolymerizing said mask; and
    (E) removing said depolymerized mask and the metallization thereon.

12. The method of claim 11 wherein said thermally depolymerizable polymer is selected from the group consisting of:
    polymethylmethacrylate acid
    polymethacrylic anhydride
    poly(methylmethacrylate-methacrylic acid-methacrylic anhydride)
    polymethacrylic acid
    poly-α-methylstyrene
    poly(pentent-1-sulfone)
    polyalkylaryl ketones
    polyphenylmethacrylate.

13. The method of claim 11 wherein said mask and the metallization thereon is removed by solvation in a solvent.

14. The method of claim 13 wherein said substrate comprises an integrated circuit device.

15. The method of claim 13 wherein said substrate comprises an alumina ceramic structure.

16. The method of claim 13 wherein said substrate comprises a glass-ceramic structure.

17. A method of forming superposed levels of metallurgy in the fabrication of an integrated circuit package comprised of a substrate having an interconnective conductive pattern on a surface thereof which constitutes the following steps in the following sequence:

(A) forming a first layer of an electrically insulating polymer on said surface (B) coating said first layer with a reactive ion resistant second layer of plasma deposited organosilicon divinyl selected from the group of tetramethyl disoloxane and hexamethyl disilazane, $Si_3N_4$ and $SiO_x$ (C) coating said second layer with a third layer of a thermally depolymerizable polymer that upon a brief thermal treatment for 1–10 minutes at a temperature of about 290° to about 320° C. undergoes degradation that allows it to be selectively soluble in a solvent system to which the first said polymer is inert (D) coating said third layer with a fourth layer resistant to reactive ion etching in an oxygen ambient (E) forming a fifth layer of a resist mask over the fourth layer and defining at least one via opening to extend to a portion of the said conductive pattern (F) reactive ion etching in $CF_4$ ambient portions of said fourth layer at said via opening (G) reactive ion etching in an oxygen ambient portions of said third layer at said via opening (H) reactive ion etching in an ambient selected from the group of $CF_4$, $CHF_3$, or mixture of $CF_4$ and $O_2$, the exposed portions of said second layer at said via opening (I) reactive ion etching in an $O_2$ ambient the exposed portion of first layer in said via opening to etch said portion of said conductive pattern with a subsequent clean up for 30 seconds using $O_2/CF_4$ mixture (J) blanket coating said substrate inclusive of said via opening with a conductive metal sixth layer, having thickness close to the said first layer (K) heating said substrate to 5–15 minutes at 290°–320° C. in a nitrogen ambient and exposing said substrate to a solvent selected from the group of diglyme and diglyme n-methyl pyrrolidone (1:1) at 60° in an etcher to cause removal of the third layer and all overlying layers thereon (L) sequentially coating the said passivation reactive ion etch stop second layer with seventh, eighth and ninth and tenth layers respectively corresponding to the composition of said first, second, third and fourth layers (M) forming a second resist mask eleventh layer having openings corresponding to desired metallurgy patterns to be deposited on said passivation etch stop second layer, said opening encompassing said via connector and adjacent discrete areas of said passivation etch stop second layer of plasma deposited organosilicon selected from the group of silicon nitride, and $SiO_x$ (N) reactive ion etching in an ambient of $CF_4$ the exposed portions of said tenth layer in the openings of said second resist mask eleventh layer (O) sequentially reactive ion etching in $O_2$ ambient said ninth layer in $O_2+CF_4$ ambient the said eighth layer and in $O_2$ ambient said seventh layer in the openings of said second resist mask (eleventh layer) to expose said via connector and adjacent portions of said second layer (P) blanket coating a twelveth layer of a conductive metal over said substrate inclusive of said via connector and said adjacent exposed portion of said passivating cum etch stop second layer (Q) heating said substrate in nitrogen ambient of about 290° to about 320° C. for time in the range of about 5 to about 15 minutes and exposing to a solvent selected from the group of diglyme or diglyme-n-methylpyrrolidone (1:1) at 60° C. in a bath carrying macronatics jet etcher and accomplishing a lift off in 1–10 minutes of all the layers above said eighth passivation etch stop layer, thereby providing second level of metallurgy.

18. The method of claim 17 where multiple interconnecting levels of metallurgy are formed by repeating the sequence of steps A through Q.

19. The method of claim 17 wherein said first layer is polyimide.

20. The method of claim 17 wherein said second layer is plasma deposited organosilicon.

21. The method of claim 17 wherein said second layer is silicon nitride.

22. The method of claim 17 wherein said third layer is a polymer depolymerizable thermally in the temperature range of 200°–350° C.

23. The method of claim 17 where the depolymerizable polymer (or copolymer) refers to a polymer derived from at least one monomeric component with a methyl group on 2 position of a double bond.

24. The method of claim 17 wherein said conductive metal is aluminum copper alloy.

* * * * *